United States Patent

Kimura et al.

[15] 3,639,856

[45] Feb. 1, 1972

[54] REENTRANT CAVITY RESONATOR SOLID-STATE MICROWAVE OSCILLATOR

[72] Inventors: Katuhiro Kimura, Toshima-ku; Yoichi Kaneko, Kokubunji-shi, both of Japan

[73] Assignee: Hitachi, Ltd., Tokyo, Japan

[22] Filed: Jan. 16, 1970

[21] Appl. No.: 3,281

[30] Foreign Application Priority Data

Jan. 24, 1969 Japan....................................44/4769

[52] U.S. Cl. ............................................331/96, 331/107 R

[51] Int. Cl. ..........................................................H03b 7/14

[58] Field of Search ....................................331/96–98, 101, 331/102, 107 R, 107 G, 107 T

[56] References Cited

UNITED STATES PATENTS

| | | | |
|---|---|---|---|
| 3,414,841 | 12/1968 | Copeland | 331/96 X |
| 2,899,646 | 8/1959 | Read, Jr. | 331/96 |
| 3,439,290 | 4/1969 | Shinoda | 331/96 X |
| 3,517,335 | 6/1970 | Dow | 331/101 |

OTHER PUBLICATIONS

Ying et al., " Characterization of Ion–Implanted Impatt Oscillators," IEEE Journal of Solid-State Circuits, Vol. SC–3, Sept. 1968, pp. 225–231.

King et al., " Frequency Modulation of Gunn Effect Oscillators," IEEE Transactions on Electron Devices, Oct. 1967, pp. 717, 718.

*Primary Examiner*—Roy Lake
*Assistant Examiner*—Siegfried H. Grimm
*Attorney*—Craig, Antonelli & Hill

[57] ABSTRACT

A solid-state oscillator which includes a reentrant cavity resonator having a resonant cavity and a post member insulated in a DC sense from a wall portion of said resonant cavity, a solid-state oscillating element disposed at the position of the highest high-frequency voltage within said reentrant cavity resonator whereby an oscillating frequency is greatly varied by changing the DC bias voltage to be applied to said element.

8 Claims, 5 Drawing Figures

FIG. Ia
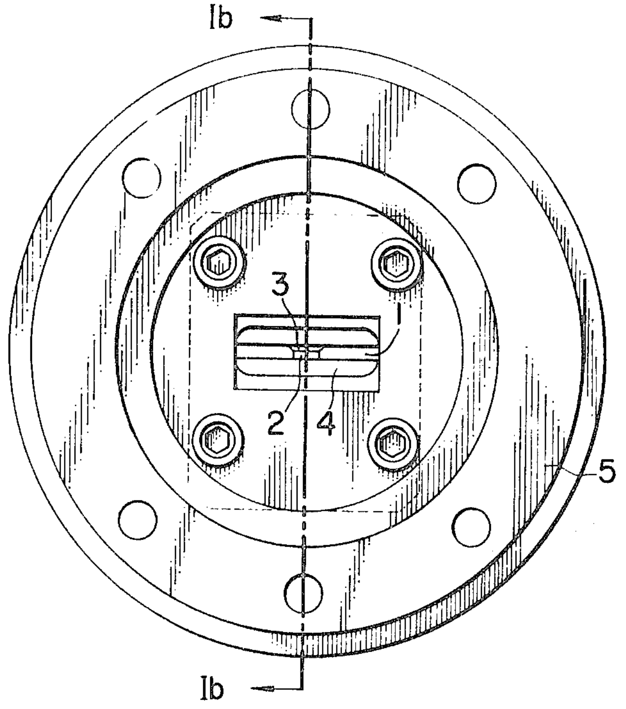
FIG. Ib
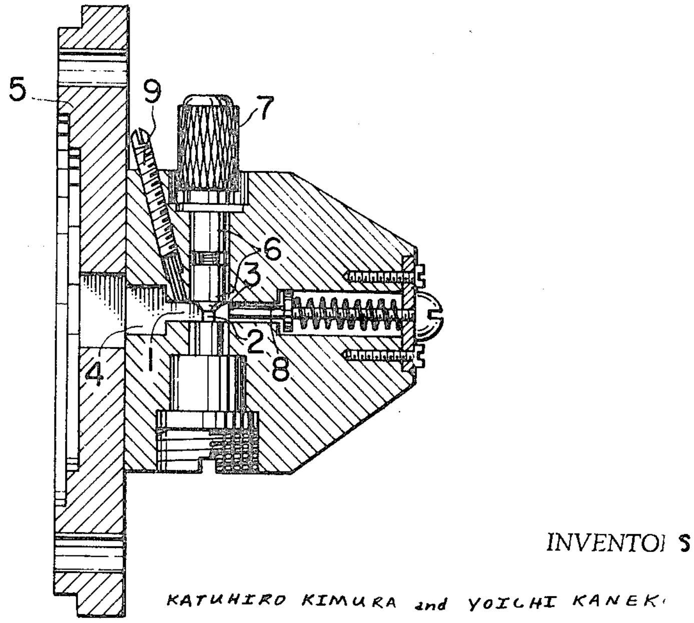
INVENTORS
KATUHIRO KIMURA and YOICHI KANEKO
BY Craig, Antonelli, Stewart & Hill
ATTORNEYS INVENTORS
KATUHIRO KIMURA and YOICHI KANEKO
BY
Craig, Antonelli, Stewart & Hill
ATTORNEYS

INVENTORS

KATUHIRO KIMURA and YOICHI KANEKO

BY Craig, Antonelli, Stewart & Hill

ATTORNEYS

REENTRANT CAVITY RESONATOR SOLID-STATE MICROWAVE OSCILLATOR

BACKGROUND OF THE INVENTION

This invention relates to a solid-state oscillator, and more particularly to a solid-state oscillator having a structure wherein a solid-state oscillating element is positioned with a reentrant cavity resonator.

Most of the cavity resonators used in solid-state oscillators are generally of the rectangular waveguide type or coaxial type, and when the oscillation frequency of the oscillator is required to be varied, it may be slightly varied by changing the bias voltage applied to the solid-state oscillating element. However, it is also common to mechanically vary the frequency by movement of a frequency adjustment screw or a short circuiting plate in the cavity resonator which will broadly vary the frequency. Thus, through the method of mechanically changing the frequency requires a complicated structure, it is necessary in order to broadly change the frequency.

However, if the ratio of the change of the oscillation frequency to the variation of the operating voltage of the solid-state oscillating element, that is, the modulation sensitivity thereof in a solid-state oscillator, can be increased, it may be possible to broadly vary the frequency thereof by changing slightly the bias voltage applied to the oscillating element. In this way the solid-state oscillator may become widely applicable to actual devices or equipment such as sweep oscillators because of its compact, light and easy to be handled properties. On the other hand, the conventional solid-state oscillator comprised by a cavity resonator of the rectangular waveguide type or coaxial type has the disadvantage that its oscillation output will change extremely if the bias voltage thereof is broadly varied in order to obtain a desired frequency change.

SUMMARY OF THE INVENTION

An object of the present invention is to provide a solid-state oscillator which has a high modulation sensitivity.

Another object of the invention is to provide a solid-state oscillator which has a slight variation of oscillating output change with respect to the frequency change thereof.

A further object of the invention is to provide a solid-state oscillator which is compact, light and easy to manufacture.

In order to perform the aforementioned objects, the solid-state oscillator of this invention comprises; a post member constructed of an extended part of an inner conductor, which conductor constitutes with an outer conductor a coaxial choke insulated in a DC sense from but disposed on at least part of the wall surface of a cavity resonator; and a solid-state oscillating element attached between an end of said post member and a wall portion of said cavity resonator opposite to the end of said post member.

The embodiment, advantages, features and effectiveness of the present invention will become apparent from the following description taken in conjunction with the accompanying drawings.

BRIEF DESCRIPTION OF THE DRAWING

FIG. 1*a* is a plan view of one embodiment of this invention;

FIG. 1*b* is a sectional view of the embodiment taken along the line 1*b*—1*b* in FIG. 1*a*

DESCRIPTION OF THE PREFERRED EMBODIMENT

Figure 2:
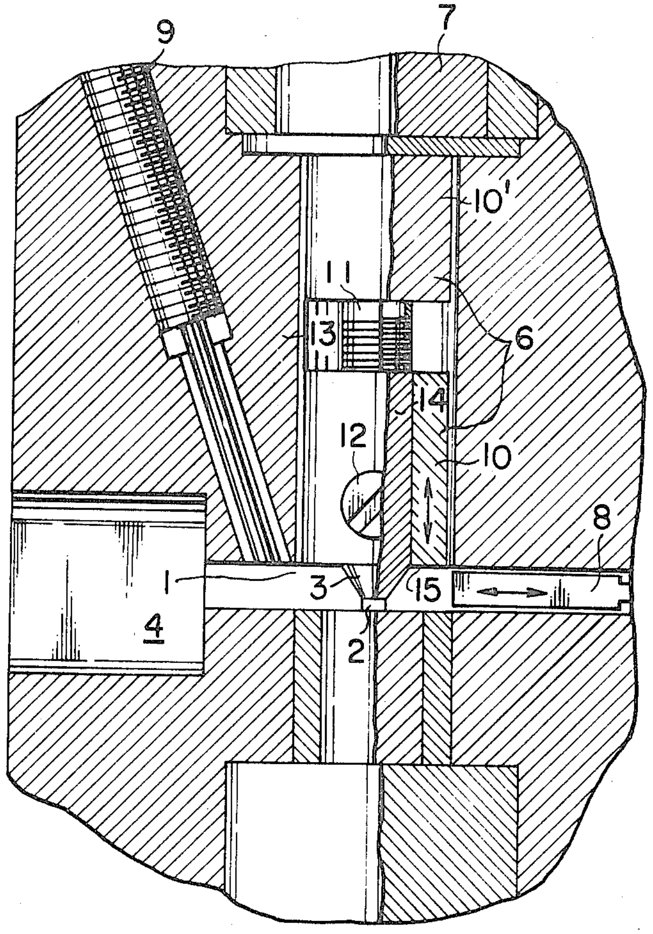
FIG. 2 is an enlarged view of the main portion of the section shown in FIG. 1*b*.

According to this invention, a solid-state oscillator employs a reentrant cavity resonator and a solid-state oscillating element such as, for example, a gunn diode, an IMPATT (impact avalanche and transit time) diode, an LSA (limited space charge accumulation) diode, etc., positioned within the reentrant resonant cavity to provide characteristic of high modulation sensitivity. The reentrant cavity resonator is composed of a cavity resonator and a post member constructed of an extended part of an inner conductor insulated in a DC sense from a wall surface of the cavity resonator and disposed on at least part of the wall surface of the cavity resonator, said inner conductor as well as an outer conductor forming a coaxial choke. The end of the post member is made of small diameter so that the capacitance of the gap between the end of the post member and the wall portion of the cavity resonator opposing the end of the post member may become negligible in comparison with the effective capacitance (the capacitance of the part contributive to the oscillation thereof) of the solid-state oscillating element positioned in the gap.

A high-frequency electric field is concentrated in the gap portion of the end of the post member of the reentrant cavity resonator constructed as described above, so that most of the capacitance which determines the resonant frequency of the cavity resonator is that of the gap portion. Therefore, the oscillation frequency of the solid-state oscillator is largely varied by the operating voltage by setting in the gap portions of solid-state oscillating element, the susceptance of which varies in response to the operating voltage.

Referring now to FIGS. 1*a* and 1*b*, the solid-state oscillator comprises a reentrant cavity resonator 1, a solid-state oscillating element 2, a post member 3, an output pickup window 4, a flange 5, a coaxial choke 6, a DC bias connector 7, a piston 8 for adjusting frequency, and a matching adjustment screw 9. In the arrangement thus described, since the general operation thereof is entirely the same as that of the conventional solid-state oscillator, the description of the operation will be omitted.

The reentrant cavity resonator 1 is constructed as a cavity of cylindrical or rectangular type, or any other cavity operable to resonate in a single mode. A DC bias voltage is applied from the DC bias connector 7 through the coaxial choke 6 and post member 3 to the solid-state oscillating element 2. The coaxial choke 6 is a high-frequency choke which prevents passage of high-frequency energy therefrom but permits the passage of the DC voltage to the element 2. The reentrant cavity resonator 1 has the output window 4 at one end thereof, the piston 8 for adjusting frequency at the other end thereof, said portion 8 forming a high-frequency choke and the matching adjustment screw 9 provides for matching it will an external load.

Reference is made to FIG. 2, which shows an enlarged view of the main portion of the device of FIG. 1*b* embodying the present invention, wherein like reference numerals are used to identify corresponding elements in the respective views. The numerals 10 and 10′ identify coaxial choke rings for adjusting the frequency of the solid-state oscillator, 11 is a spring, 12 is a fixed screw for retaining the choke ring 10, and 13 and 14 are inner and outer conductors, respectively. The coaxial choke 6 comprises the coaxial choke rings 10 and 10′, and the inner and outer conductors 13 and 14.

The reentrant cavity resonator 1 is composed of a resonator, for example, a cylindrical resonator, at least a part of the upper wall portion (in case of FIG. 2, all of the upper wall portions) of which is formed by the end surface 15 of the coaxial choke 6, and the part of the post member 3 projecting from the end surface 15 of the resonator. The solid-state oscillating element 2 is set between the end of the post member 3 and the lower wall portion of the reentrant cavity resonator. Thus, it is easy to manufacture the solid-state oscillating element for this type of structure by using the end surface 15 of the coaxial choke as the upper wall portion of the reentrant cavity resonator, which may also provide effective heat dissipation. It follows that since the solid-state oscillating element 2, such as, for example, a gunn diode, is extremely small to the extent where normally a rectangle of one side thereof is approximately 100 microns in size, it has the advantage that it is possible to positively dispose the gunn diode in the part of the highest high-frequency voltage within the reentrant cavity resonator and that the heat dissipation may be effectively achieved from the lower wall portion of the resonator 1, thereby rendering the aforementioned structure extremely superior to known devices.

The coaxial choke 6 comprises the outer conductor 13, two coaxial choke rings 10 and 10′ of a length λ/4(λ: a guide wavelength), and the inner conductor 14, and is designed in such a manner that the outer conductor 13 and the coaxial choke rings 10 and 10′ are short circuited in a high-frequency sense and are insulated in a DC sense by providing a gap of approximately 10 to 20 microns therebetween. Thus, the diameter of the coaxial choke 6 may be enlarged by using a part of the coaxial choke 6 as the upper wall portion of the reentrant cavity resonator 1.

The larger the ratio between the diameter $D_1$ of the coaxial choke rings 10 and 10′ and the diameter $D_2$ of the inner conductor 14, that is $D_1/D_2$, is, the lower the impedance of the coaxial choke 6 is, and the less the loss of the high-frequency energy from the choke 6 becomes. For example, according to experiments, the amount of leakage energy from the choke 6 was in the range of 50 db. of the oscillating output. And, since the solid-state oscillating element is extremely small and this as aforementioned, the mechanical strength thereof is weak. Therefore, the spring 11 is inserted between two coaxial choke rings 10 and 10′ in order to adjust the pressure and absorb any mechanical shock to be applied to the solid-state oscillating element 2. One coaxial choke ring 10 forming the upper wall of the reentrant cavity resonator 1 is made so as to move axially along with the inner conductor 14 serving as an axis thereby making it possible to widely change the frequency thereof. In assembling, after the frequency band is determined, the coaxial choke ring 10 is fixed to the inner conductor 14 by means of the screw 12.

The oscillating frequency of the solid-state oscillator may be electrically changed over a wide range by varying the capacitance of the gap portion of the end of the post member 3 as aforementioned. There exists a predetermined relationship between the capacitance of the gap between the end of the post member 3 and the lower wall portion of the resonator, which is related to the area of the end of the post member and the capacitance which varies in accordance with the bias voltage of the solid-state oscillating element, which is related to the area of the part contributing to the oscillation of the solid-state oscillating element. As a result, the less the capacitance of the gap of the end of the post member 3 in comparison with the capacitance varying by the bias voltage is, the higher the modulation sensitivity becomes. According to experiment, the capacitance of the gap loaded in parallel with the solid-state oscillating element may be made comparable to or a half of or less than a half of the electrostatic capacitance determined by the dielectric constant of the element by designing the sectional area of the end of the post member 3 to be 18 times as small as the sectional area or effective area of the element, of the part contributive to the oscillation of the solid-state oscillating element, so that the modulation sensitivity of this invention is 10 to 20 times as large as that of the conventional solid-state oscillating element.

The less the ratio between the area $S_1$ of the end of the post member and the effective area $S_2$ of the element, that is, $S_1/S_2$ is, the higher the modulation sensitivity becomes. On the contrary the larger the ratio becomes, the less the modulation sensitivity becomes. If the value of this ratio $S_1/S_2$ is so designed as to be within the range of approximately one to 20, when operating as a reentrant cavity resonator, superior characteristics of modulation sensitivity may be obtained.

Though the post member 3 may be of cylindrical shape, since it becomes extremely thin in consideration with the size of the solid-state oscillating element, the electric power loss produced by the surface resistance becomes large. Therefore, it is preferable to use a conical or pyramidal shaped post member in order to enlarge the surface area thereof. Though the lower wall portion of the reentrant cavity resonator 1 shown in this embodiment is flat and the solid-state oscillating element 2 is positioned on the lower wall portion, it also may be possible to form a projection similar to the post member 3 on the lower wall and the solid-state oscillating element 2 may be positioned between the projection and the post member 3. Since this structure may further lessen the capacitance of the gap portion of the post member 3, the modulation sensitivity of the solid-state oscillator may be further increased.

Figure 3A:
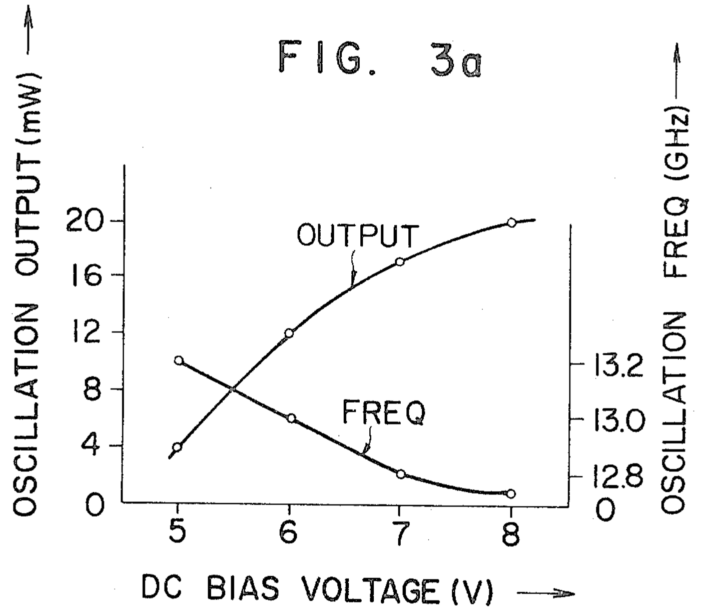
FIGS. 3*a* and 3*b* are graphic diagrams showing operational characteristics of the cases using the solid state oscillator of 13 GHz. and 18 GHz. bands, respectively.
Figure 3B:
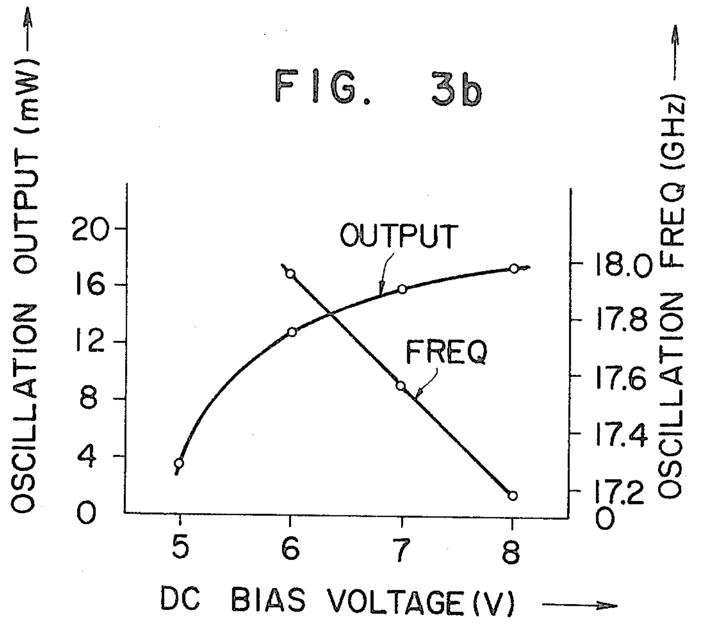

Referring now to FIGS. 3a and 3b, which show the graphical diagrams of the operating characteristics of this invention, FIG. 3a shows the case using, a resonator of 13 GHz. band and the relationship between the DC bias voltage to be applied to the solid-state oscillating element and the oscillating output and frequency. As clear from these graphic diagrams of the characteristics thereof, the modulation sensitivity is extremely good, such as shown by about 200 MHz./v. in 13 GHz. band and by about 400 MHz./v. in 18 GHz. band, and both of the oscillating outputs thereof are within 3 db.

It should be understood from the foregoing description that since the present invention serves to provide a solid-state oscillating element which comprises a cavity of least capacitance of the circuit as a resonating circuit, the modulation sensitivity thereof may be sufficiently raised with the result that it is possible to electrically change the frequency over a wide range and yet the structure thereof may be compact and easy to manufacture.

Although the present invention has been described with reference to but a single embodiment, it is to be understood that the scope of the invention is not limited to the specific details thereof, but is susceptible of numerous changes and modifications as would be apparent to one with normal skill in the pertinent technology.

What we claim is:

1. A solid-state oscillator comprising a reentrant cavity resonator including a resonant cavity and a post member extending into said cavity and formed by an extended part of an inner conductor of a coaxial choke, said choke forming at least a part of the wall surface of said resonant cavity and said inner conductor thereof being insulated in a direct current sense from said wall surface, a solid-state oscillating element positioned between the end of said post member within said cavity and the wall surface of said cavity opposite thereto, means for applying a bias voltage through said coaxial choke to said oscillating element, and means for deriving an output from said oscillating element, said coaxial choke including a pair of coaxial choke rings and spring means positioned therebetween fro absorbing mechanical shocks applied to said oscillating element.

2. A solid-state oscillator as defined in claim 1, wherein said post member is tapered to provide a reduced end surface.

3. A solid-state oscillator as defined in claim 1, wherein the area of the end of said post member in said cavity is between 1 and 1/20th the size of area of the element contributing to the oscillation thereof.

4. A solid-state oscillator as defined in claim 1, wherein said cavity resonator further includes a projection on said wall surface of said cavity resonator opposite to the end of said post member, said oscillating element being positioned between said post member and said projection.

5. A solid-state oscillator as defined in claim 1, wherein one of said pair of coaxial choke rings is axially movable so as to permit adjustment of the frequency band thereof.

6. A solid-state oscillator as defined in claim 5, wherein the area of the end of said post member in said cavity is between 1 and 1/20th the size of area of the element contributing to the oscillation thereof.

7. A solid-state oscillator as defined in claim 6, wherein said cavity resonator further includes a projection on said wall surface of said cavity resonator opposite to the end of said post member, said oscillating element being positioned between said post member and said projection.

8. A solid-state oscillator as defined in claim 5, wherein said post member is tapered to provide a reduced end surface.

* * * * *